United States Patent [19]

Ahmed

[11] 4,047,057

[45] Sept. 6, 1977

[54] MONOSTABLE SWITCHING CIRCUIT

[75] Inventor: Adel Abdel Aziz Ahmed, Annandale, N.J.

[73] Assignee: RCA Corporation, New York, N.Y.

[21] Appl. No.: 716,538

[22] Filed: Aug. 23, 1976

[51] Int. Cl.² .................. H03K 3/02; H03K 5/04
[52] U.S. Cl. ..................... 307/273; 307/246; 307/261; 307/266; 307/293
[58] Field of Search ............. 307/246, 252 J, 252 W, 307/265, 266, 268, 269, 273, 274, 293, 106, 108

[56] References Cited

U.S. PATENT DOCUMENTS

| | | | |
|---|---|---|---|
| 3,244,907 | 4/1966 | Daigle, Jr. ................ | 307/266 X |
| 3,396,282 | 8/1968 | Sheng et al. ................ | 307/273 X |
| 3,996,482 | 12/1976 | Lockwood ................. | 307/246 X |

Primary Examiner—John Zazworsky
Attorney, Agent, or Firm—H. Christoffersen; A. L. Limberg; R. G. Coalter

[57] ABSTRACT

An input signal activates a current source for charging a capacitor. A first switch is closed and a memory element is subsequently SET as the capacitor voltage increases. When SET, the memory element closes a second switch and reverses the charging current whereupon the first switch is subsequently opened. The memory element is RESET upon termination of the input signal whereupon the cycle may be repeated. The switches may be connected in series for providing an output indication during the period both are closed.

16 Claims, 3 Drawing Figures

MONOSTABLE SWITCHING CIRCUIT

This invention relates to electrical circuits and particularly to delayed monostable switching circuits.

A delayed monostable switching circuit, as that term is used herein, is a switching circuit which produces an output signal having a desired duration or width and which occurs subsequent to a specified change in an input signal. Such sequential pulse generation circuits are used in diverse applications. For example, they are used in radar, sonar and also in coin operated vending machines to control what is commonly called a "range gate" for distinguishing between valid and invalid target echoes (in a vending machine the "target" is a moving coin).

A known form of delayed monostable switching circuit comprises a cascade connection of two monostable multivibrators. Advantages of cascaded multivibrators are: (1) the pulse width and position may be independently controlled; (2) the control is continuous rather than in discrete steps; and (3) a very wide control range (i.e., several decades) may be obtained. heretofore, however, these advantages have been offset by certain disadvantages. For example, two timing capacitors are needed, one for each multivibrator. This is a disadvantage not only from an economic standpoint (capacitors are expensive and space consuming items) but also from a performance standpoint. For example, where it is desired to maintain a constant pulse width/pulse position ratio, use of more than one capacitor introduces variables which may make such control difficult. A further disadvantage of the cascaded multivibrator approach is that conventional multivibrator circuits require a power supply and may dissipate power when operating in a steady-state or standby mode.

The present invention is directed to meeting the need for a delayed monostable switching circuit in which the advantages of the cascaded multivibrator approach may be obtained but which does not require two timing capacitors, which does not require a circuit power supply or other source of power other than tht obtainable from the trigger input signal and in which the circuit standby power dissipation may be zero.

Figure 1:
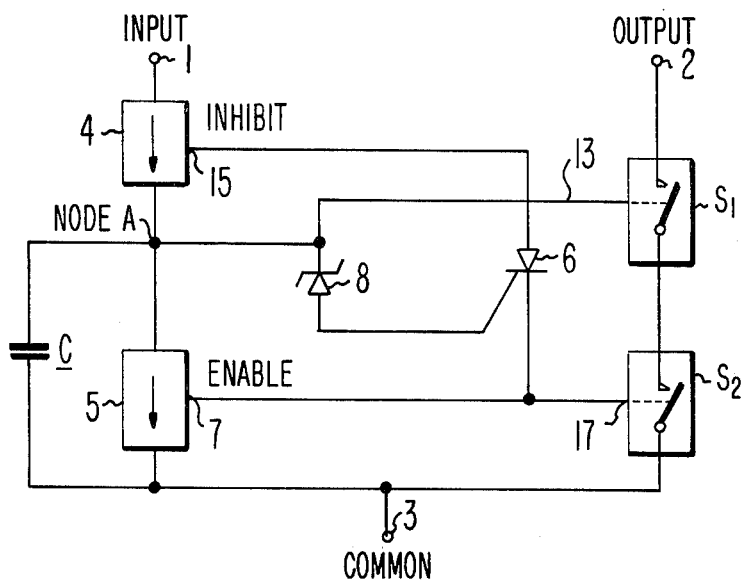
FIG. 1 is a block diagram of a delayed monostable switching circuit embodying the invention.

In FIG. 1 terminal 1 is an input terminal for receiving an input signal, terminal 2 is an output terminal for providing an output indication and terminal 3 is a common terminal for connection to a reference potential point such as ground. Capacitor C, connected between node A and common terminal 3, is the circuit timing capacitor. The single capacitor, as will be explained, controls both the output pulse position and the output pulse width.

Current is supplied to and withdrawn from capacitor C via current sources 4 and 5, respectively. Current source 4 is connected between input terminal 1 and node A and includes an inhibit terminal 15 which disables the source when current is withdrawn therefrom. Current source 5, connected between node A and terminal 3, is enabled by current supplied to its enable input terminal 7.

Node A is connected directly to switch $S_1$ and via Zener diode 8 to the gate terminal of thyristor 6. The anode of thyristor 6 is connected to inhibit terminal 15 and its cathode is connected to enable terminal 7 and to switch $S_2$. Normally open switches $S_1$ and $S_2$ are connected in series between terminals 2 and 3.

In operation, input terminal 1 is normally at the potential of common terminal 3 in the quiescent state. This corresponds to time $t_o$ in FIG. 3 and in this condition, switches $S_1$ and $S_2$ are open, thyristor 6 is off, capacitor C is discharged and no current is supplied to or withdrawn from node A.

At time $t_1$, when the input signal changes from zero to a positive value ($V_s$), current source 4 is turned on to supply charging current to capacitor C. Because of this, the voltage on capacitor C will begin to increase.

The voltage on capacitor C is applied directly to the switch $S_1$ via lead 13. At time $t_2$ this voltage reaches a level sufficient to close this switch. At this level, however, thyristor 6 is still off so that switch $S_2$ remains open. If the capacitor voltage continues to increase to the level shown at $t_3$, the threshold voltage of Zener diode 8 is exceeded. Current then flows from node A to the gate of thyristor 6 via Zener diode 8 causing thyristor 6 to turn on. In response thereto current is withdrawn from inhibit terminal 15 of current source 4 and supplied to enable terminal 7 of current source 5. This turns on source 5 which serves as a discharge path for capacitor C. Th voltage at node A now decreases its value (see m-2 FIG. 3). Concurrently, current is supplied via lead 17 to close switch 2, thereby completing a path between terminals 2 and 3 through switches $S_1$ and $S_2$.

At time $t_4$ the voltage at node A falls below the turn on threshold voltage of switch 1. This causes switch 1 to open so that there is no longer a current path between terminals 2 and 3. This condition represents the end of the output signal.

Capacitor C will continue to discharge until finally (at time $t_5$) the voltage at node A is substantially zero. Thyristor 6 remains conductive and switch $S_2$ remains closed until such time ($t_6$) as the input signal returns to its initial value (zero volts). When this occurs, thyristor 6 reverts to its non-conductive state thereby opening switch $S_2$ and the cycle may be repeated.

Figure 2:
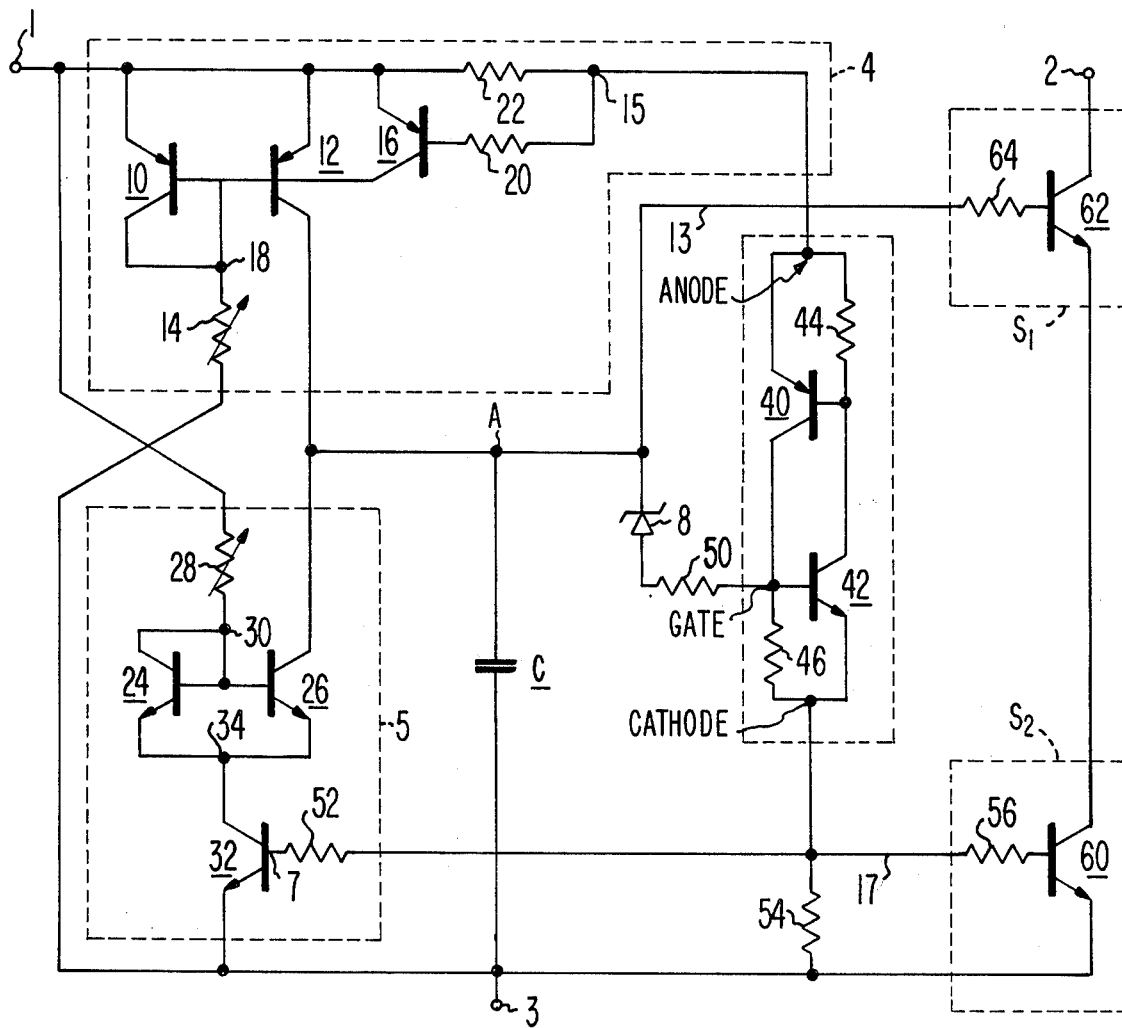
FIG. 2 is a schematic diagram of the circuit of FIG. 1.

It is an advantage of the switching circuit of FIG. 1 that but a single capacitor is needed to control both the output pulse position (times $t_1 - t_3$) and the output pulse width (times $t_3 - t_4$). Thus the ratio of the pulse width divided by the pulse period is completely independent of the value of capacitor C. Capacitor C is also operated with one terminal connected to the reference potential (in this case ground). This is of practical importance in an integrated circuit embodiment of the invention where the number of circuit terminals is to be minimized. A further advantage of the circuit is that, during the interval of time ($t_3$ through $t_6$) that thyristor 6 is conductive, the circuit cannot be falsely triggered by positive noise transients which may be present at terminal 1. Yet another advantage of the circuit is that it may be implemented without need for any power source other than that obtainable from the input signal applied to terminal 1. Since that signal is normally at the potential of common terminal 3, no power is consumed in the quiescent or steady state condition of the circuit. Stated another way, the delayed monostable switching circuit of FIG. 1 may be implemented entirely with signal powered circuit components. FIG. 2 shows how this may be done.

In FIG. 2 current source 4 (outlined by dashes) comprises PNP transistors 10 and 12 which are connected as a current mirror amplifier (CMA), variable resistor 14 which controls the CMA input current, and PNP transistor 16 which is connected to inhibit operation of the CMA. Specifically, transistors 10 and 12 are connected at the emitters thereof to input terminal 1 and at the bases thereof to node 18. The collectors of transistors 10 and 12 are connected, respectively, to node 18 and node A. Variable resistor 14 is connected between node 18 and terminal 3 for supplying input current to the CMA proportional to the voltage across terminals 1 and 3. The collector emitter path of transistor 16 is connected between terminal 1 and node 18 for clamping node 18 to the potential of terminal 1 when base current is withdrawn from transistor 16. Inhibit terminal 15 is coupled to the base of transistor 16 via resistor 20 and to input terminal 1 via resistor 22. Normally, with no current withdrawn from inhibit terminal 15 iva thyristor 6, resistors 22 and 20 maintain transistor 16 off thereby permitting operation of the CMA (in response to an input signal at 1). When current is withdrawn from terminal 15 the current flowing through resistor 20 turns transistor 16 on thereby clamping node 18 to the potential of terminal 1 which inhibits the CMA.

Current source 5 comprises NPN transistors 24 and 26 which are also connected as a CMA. This CMA receives input current via variable resistor 28 connected between its input terminal 30 and circuit input terminal 1. The collector-emitter path of transistor 32 is connected between the CMA common terminal 34 (that is the emitters of transistors 24 and 26) and terminal 3. The base 7 of transistor 32 corresponds to the enable terminal 7 of current source 5. In the absence of current supplied to base 7, transistor 32 is non-conductive thereby inhibiting operation of the current source. Conversely, when current is supplied to base 7, node 34 is clamped to the potential of common terminal 3 so that the CMA (comprising transistors 24 and 26) withdraws current from node A having a magnitude controlled by the value of variable resistor 28, the voltage at input terminal 1 and the ratio of the base-emitter junction areas of transistors 24 and 26.

Thyristor 6 comprises PNP transistor 40 and NPN transistor 42, the collector of each being connected to the base of the other. The emitter of transistor 40 corresponds to the anode terminal and the emitter of transistor 42 serves as the cathode terminal. Each of transistors 40 and 42 may have a resistor (such as resistors 44 and 46) connected across the base-emitter junctions thereof to improve the noise immunity of the device. The gate of thyristor 6 (i.e., the base of transistor 42) is coupled by a current limiting resistor 50 to the anode of Zener diode 8 which is connected at the cathode thereof to node A. The cathode of thyristor 6 is connected via resistors 52, 54 and 56, respectively, to the base of transistor 32, to common terminal 3, and to the base of transistor 60. The anode of thyristor 6 is connected directly to inhibit terminal 15 of current source 4.

Switches $S_1$ and $S_2$ comprise, respectively, transistors 62 and 60. The collector of transistor 62 is connected to output terminal 2 and its emitter is connected via the collector emitter path of transistor 60 to terminal 3. The base of transistor 62 is connected via current limiting resistor 64 to node A.

Figure 3:
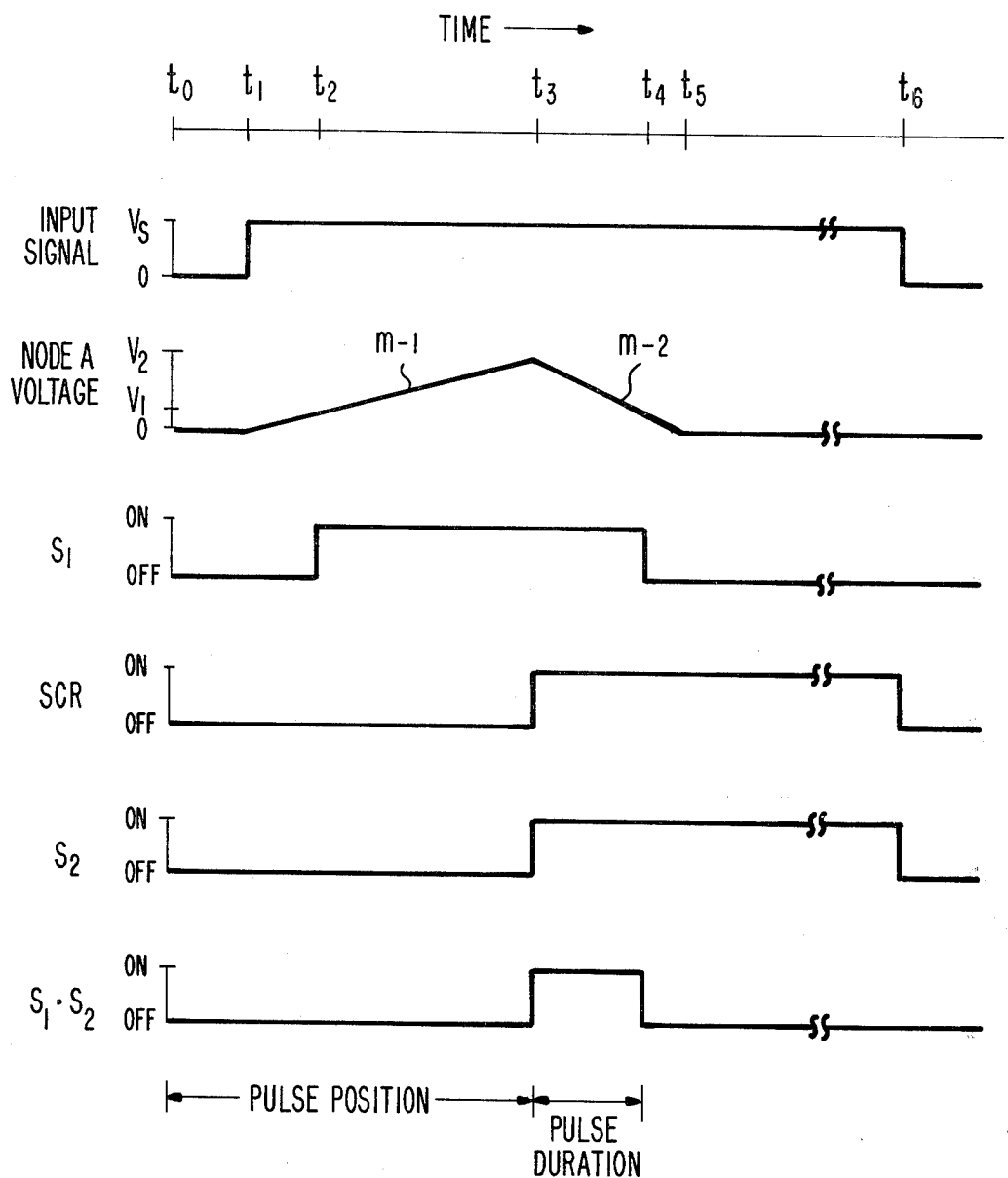
FIG. 3 is a timing diagram illustrating operation of FIGS. 1 and 2.

In the discussion which follows of the operation of the circuit of FIG. 2, the timing diagram of FIG. 3 should be referrd to. At time $t_o$, the input signal is at zero volts (i.e., the potential of common terminal 3), capacitor C is discharged and no currents flow in the circuit. Since no base current is applied to transistors 60 and 62 they are non-conductive (i.e., open switches) so that no current path exists between output terminal 2 and common terminal 3.

At time $t_1$, when the input signal charges from zero to a positive value $V_s$, current will flow through resistor 14 causing a voltage to be produced across the base emitter junction of transistor 10 thereby biasing transistor 12 to supply a collector current to node A proportional to the current conducted by resistor 14 multiplied by the ratio of the base emitter junction areas of transistors 10 and 12. At this point, thyristor 6 is off, as well as current source 5, so that charge will begin to accumulate on capacitor C thereby increasing the voltage of node A.

At time $t_2$ the node A voltage reaches a value sufficient to prime transistor 62 to conduct current. While this represents a closed switch $S_1$, a complete path does not exist between output terminal 2 and common terminal 3 because switch $S_2$ is still open (no base current is supplied to transistor 60).

At time $t_3$ the node A voltage has increased to a level sufficient to drive Zener diode 8 into conduction. This current flows through current limiting resistor 50 to the gate of thyristor 6 and causes transistor 42 to turn on. Collector current of transistor 42, applied to the base of transistor 40, causes transistor 40 to turn on also, which provides collector current to the base of transistor 42. This action is regenerative so that once transistors 40 and 42 are triggered on they will remain on so long as the current which they conduct is greater than some minimum value (for thyristors this is normally called the "holding current").

The values of resistors 22 and 20 are chosen to insure that when thyristor 6 turns on, transistor 16 also turns on. This places a low impedance between the input (18) and common (1) terminals of the CMA 10, 12, turning off current source 4. The current flowing from inhibit terminal 15 of current source 4 through the thyristor 6 flows in part to the enable terminal 7 of current source 5, turning source 5 on. This causes capacitor C to start to discharge (time $t_3$) through the output current path (collector-to-emitter path of transistor 26) of the CMA of current source 5. The voltage at node A now starts to decrease.

Also, at time $t_3$, in addition to reversing the direction of current flow to node A, thyristor 6 supplies current via resistor 56 to the base of transistor 60, which turns on. Thus, at this time transistors 60 and 62 are both on so that a conductive path exists between output terminal 2 and common terminal 3. This condition represents the beginning or leading edge of the circuit output pulse. The pulse may be sensed, for example, by applying a positive voltage level to output terminal 2 and detecting either current flow to terminal 2 or a change in voltage across terminals 2 and 3.

At time $t_4$ the voltage at node A reaches a level such that inadequate current is supplied via resistor 64 to the base of transistor 62 to maintain transistor 62 on. Transistor 62 therefore turns off and opens the path between terminal 2 and terminal 3. This represents the termination or end of the output pulse. Since thyristor 6 is in a latched condition, current continues to flow between terminals 15 and 7 so that capacitor C continues to discharge until, at time $t_5$, it is fully discharged and node A is at the potential of common terminal 3. The effect at this time on the current mirror amplifier comprising transistors 24 and 26 in current source 5, is that transistor 26 saturates.

At time $t_5$ thyristor 6 is on, transistor 60 is on, and capacitor C is fully discharged. The circuit remains in this state until time $t_6$, that is, until the input signal terminates (i.e., the potential at terminal 1 returns to the potential of common terminal 3, zero volts). This reduces the flow of current through thyristor 6 to zero so that transistors 40 and 42 revert to an off condition and the cycle may be repeated.

The circuit of FIG. 2 has a number of important advantages. For example, during the period that thyristor 6 is on (time $t_3$ through $t_6$) false retriggering due to positive transients which may be present at input terminal 1 cannot occur. The circuit requires no power supply since its operating power is derived directly from the input signal applied to input terminal 1 and the ratio of the pulse position and pulse width is not affected by variations in capacitor C. Also, in the steady state condition the circuit power dissipation is zero.

In applications where it is desired to control either the pulse position or the pulse width by means other than the adjustment of resistor values, one may eliminate resistors 14 or 28 (or both) and apply suitable control currents directly to terminals 18 and 30. Terminal 18, the input of the CMA comprising transistors 10 and 12, controls the pulse position in proportion to current withdrawn therefrom. Terminal 30 is the input of the CMA comprising transistors 24 and 26 and controls the pulse width in proportion to current supplied thereto.

In summary, in each example of the invention given, a change in an input signal from a first level to a second level causes a current source to supply charging current to a capacitor. When the capacitor voltage reaches a first threshold value, a first switch is closed and when it reaches a second threshold value a memory element (thyristor 6) initially in a first state, changes to a second state. In its second state, the memory element produces a signal which closes a second switch and simultaneously reverses the sense of the charging current thereby causing a decrease in the capacitor voltage so that the first switch is subsequently opened. The memory element is reset to its first state by returning the input signal to its first level whereupon the cycle may be repeated. The circuit may be used as a delayed monostable multivibrator or "range gate" by connecting the switches in series with a suitable signal source.

In applications where a switched output signal is not needed, an output signal may be obtained from another point in the circuit (such as node A) and the output switches ($S_1$ and $S_2$ in FIG. 1, or transistors 60 and 62 in FIG. 2) may be eliminated. Other modification may be made to the circuit. For example, although capacitor C is illustrated as being connected between node A and the common terminal, it may instead be connected between node A and an external reference potential point (not shown) which may be at the same or a different voltage level than terminal 3. Thyristor 6 may be replaced by other suitable memory elements having similar bistable characteristics.

What is claimed is:

1. A circuit, for producing a momentary output signal manifestation in response to a change in an input signal from a first level to a second level; said circuit comprising:
   current source means having first and second input terminals for receiving said input signal thereacross, an output terminal responsive to said input signal when it is at said second level for producing an output current, and first and second control terminals for controlling the sense of said output current in accordance with the magnitude of a control current conducted between said control terminals, said control current having first and second magnitudes;
   normally open switch means connected between said first and second control terminals for conducting said control current therebetween when closed and for blocking the flow of said control current when open, said switch means including a trigger terminal responsive to a trigger signal supplied thereto for closing said switch and means for maintaining said switch closed once triggered; and
   means for applying a trigger signal to said trigger terminal of said normally open switch means, said means including a circuit reference potential point, a capacitor connected between said reference potential point and said output terminal of said current source and a threshold conduction device connected between said output terminal and said trigger terminal.

2. The circuit as recited in claim 1 further comprising:
   first and second output switches, each having an output path normally in a first conductive state, and a control electrode responsive to a separate signal supplied thereto for changing to a second conductive state;
   means coupling said output paths of said output switches in series for providing an output signal indication in accordance with the conductive states of said paths; and
   means for applying separate signals to said control electrodes comprising means coupling the control electrode of said first switch to said output terminal of said current source means and means coupling said control electrode of said second switch to a selected one of said two control terminals of said current source means.

3. A circuit as recited in claim 1 wherein said current source means comprises:
   a first current mirror amplifier having a common electrode connected to said first input terminal, an output electrode connected to said output terminal and an input electrode for receiving a first input current;
   a first control switch connected between said input and common electrodes and having a control electrode coupled to said first control terminal;
   a second current mirror amplifier having a common electrode for connection to said second input terminal, an output electrode connected to said output terminal and an input electrode for receiving a second input current; and
   means for connecting said common electrode of said second current mirror amplifier to said second terminal comprising a second control switch coupled therebetween and having a control electrode connected to said second control terminal.

4. The circuit as recited in claim 2 wherein said normally open switch means comprises a thyristor having an anode terminal connected to said first control terminal, a cathode terminal connected to said second control terminal and a gate electrode, said gate electrode corresponding to said trigger terminal.

5. The circuit as recited in claim 2 wherein said threshold conduction device comprises a Zener diode having an anode terminal connected to said trigger terminal and a cathode terminal connected to said output terminal.

6. The circuit as recited in claim 3 further comprising:
a first impedance connected between said input electrode of said first current mirror amplifier and said second terminal; and
a second impedance connected between said input electrode of said second current mirror amplifier and said first terminal.

7. In combination:
first and second terminals for receiving an input signal thereacross;
a node for connection to an energy storage element;
a first current source connected between said first terminal and said node for conducting a first current therebetween in one sense when said input signal is present, said first current source having an inhibit terminal for receiving an inhibit signal;
a second current source connected between said second terminal and said node for conducting a second current therebetween of opposite sense when said input signal is present, said second current source having an enable terminal for receiving an enable signal;
bistable switch means having a normally non-conductive path connected between said inhibit and enable terminals and having also a trigger electrode responsive to a trigger signal for placing said path of said bistable switch means in a latched conductive state; and
means for applying said trigger signal to said trigger electrode comprising a threshold conduction device connected between said trigger electrode and said node.

8. The combination as recited in claim 7 further comprising:
first and second output switches, each having an output path normally in a first conductive state, and a control electrode responsive to a separate signal supplied thereto for changing to a second conductive state;
means coupling said output paths of said output switches in series for providing an output signal indication in accordance with the conductive state of said paths; and
means for applying said separate signals to said control electrodes comprising means coupling the control electrode of said first switch to said node and means coupling said control electrode of said second switch to said enable input terminal of said second current source.

9. The combination recited in claim 7 wherein said bistable switch means comprises a thyristor having an anode electrode connected to said inhibit terminal, a cathode connected to said enable terminal and a gate electrode corresponding to said trigger electrode.

10. The combination as recited in claim 7 wherein said first current source comprises:
a first current mirror amplifier having a common electrode connected to said first terminal, an output electrode connected to said node and an input electrode for receiving a first input current and a first control switch connected between said input and common electrodes and having a control electrode coupled to said inhibit terminal; and wherein said second current source comprises:
a second current mirror amplifier having a common electrode for connection to said second terminal, an output electrode connected to said node and an input electrode for receiving a second input current; and
means for connecting said common electrode of said second current mirror amplifier to said second terminal comprising a second control switch coupled therebetween and having a control electrode connected to said enable terminal.

11. The combination recited in claim 7 wherein said threshold conduction device comprises a Zener diode having an anode terminal connected to said trigger electrode and a cathode terminal connected to said node.

12. The combination as recited in claim 10 further comprising:
a first impedance connected between said input electrode of said first current mirror amplifier and said second terminal; and
a second impedance connected between said input electrode of said second current mirror amplifier and said first terminal.

13. In combination;
a capacitor;
a first current source connected across said capacitor for supplying a charging current thereto in response to an input signal;
a second current source;
first means responsive to the voltage across said capacitor when it reaches a given level for connecting the second current source across said capacitor in a sense to discharge the same and for disabling said first current source; and
second means coupled to said capacitor responsive to the voltage thereacross after it reaches said given level for producing an output signal indication of a duration dependent on the time required for said voltage to reduce to a second, lower level.

14. The combination recited in claim 13 further comprising a circuit input terminal, a reference terminal and a node, said capacitor being connected between said reference terminal and said node, and wherein:
said first current source comprises a first current mirror amplifier having an input terminal for receiving input current of a first sense, a common terminal connected to said circuit input terminal and an output terminal connected to said node; and wherein
said second current source comprises a second current mirror amplifier having an input terminal for receiving input current of a second sense, a common terminal for connection to said reference terminal and an output terminal connected to said node.

15. The combination recited in claim 14 wherein said first means comprises:
first switch means connected between said input and common terminals of said first current mirror amplifier, said first switch means having a control electrode;
second switch means connected between said common terminal of said second current mirror amplifier and said reference terminal and having also a control electrode; and thyristor switch means having a main conduction path connected between said control electrodes of said first and second switch means and having a trigger electrode coupled to said node.

16. The combination recited in claim 15 wherein said second means comprises:

a circuit output terminal for providing said output signal indication;

a pair of normally open switches connected in series between said circuit output terminal and said reference terminal, each switch having a control electrode;

means coupling the control electrode of one of said pair of switches to said node; and means coupling the control electrode of the other of said pair of switches to said control electrode of said second switch means.

* * * * *